United States Patent
Sahu et al.

(10) Patent No.: US 9,634,026 B1
(45) Date of Patent: Apr. 25, 2017

(54) STANDARD CELL ARCHITECTURE FOR REDUCED LEAKAGE CURRENT AND IMPROVED DECOUPLING CAPACITANCE

(71) Applicant: QUALCOMM Incorporated, San Diego, CA (US)

(72) Inventors: Satyanarayana Sahu, San Diego, CA (US); Xiangdong Chen, San Diego, CA (US); Ramaprasath Vilangudipitchai, San Diego, CA (US); Dorav Kumar, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 15/209,650

(22) Filed: Jul. 13, 2016

(51) Int. Cl.
| | | |
|---|---|---|
| *H03K 19/00* | (2006.01) | |
| *H01L 27/11* | (2006.01) | |
| *H01L 27/118* | (2006.01) | |
| *H03K 19/003* | (2006.01) | |
| *H01L 27/02* | (2006.01) | |
| *H01L 27/092* | (2006.01) | |
| *H03K 19/177* | (2006.01) | |

(52) U.S. Cl.
CPC .... *H01L 27/11807* (2013.01); *H01L 27/0266* (2013.01); *H01L 27/092* (2013.01); *H03K 19/0008* (2013.01); *H03K 19/00361* (2013.01); *H03K 19/17728* (2013.01); *H03K 19/17736* (2013.01); *H01L 2027/11811* (2013.01); *H01L 2027/11861* (2013.01); *H01L 2027/11875* (2013.01)

(58) Field of Classification Search
CPC ............... H01L 23/5286; H01L 27/088; H01L 2027/11874; H01L 21/823437; H01L 21/823475; H01L 2027/11861; H01L 2027/11866; H01L 21/76895; H01L 21/823871; H01L 23/528; H01L 29/78; H01L 29/94; H03K 19/17736; H03K 19/0013; H03K 3/35625; H03K 19/0016; H03K 19/003; H03K 19/00307; H03K 19/00315; H03K 19/00346; H03K 19/00353; H03K 19/00361; G11C 16/0433
See application file for complete search history.

(56) References Cited

U.S. PATENT DOCUMENTS

| | | |
|---|---|---|
| 7,705,666 B1 * | 4/2010 | Hsu ........................ H03K 19/20 327/551 |
| 7,728,362 B2 | 6/2010 | Correale, Jr. et al. |
| 7,919,793 B2 | 4/2011 | Iwata |
| 8,124,469 B2 | 2/2012 | Acharya |
| 8,134,824 B2 | 3/2012 | Frederick, Jr. et al. |

(Continued)

*Primary Examiner* — Vibol Tan
(74) *Attorney, Agent, or Firm* — Arent Fox LLP (57) ABSTRACT

A standard cell IC may include a plurality of pMOS transistors each including a pMOS transistor drain, a pMOS transistor source, and a pMOS transistor gate. Each pMOS transistor drain and pMOS transistor source of the plurality of pMOS transistors may be coupled to a first voltage source. The standard cell IC may also include a plurality of nMOS transistors each including an nMOS transistor drain, an nMOS transistor source, and an nMOS transistor gate. Each nMOS transistor drain and nMOS transistor source of the plurality of nMOS transistors are coupled to a second voltage source lower than the first voltage source.

12 Claims, 8 Drawing Sheets

(56) References Cited

U.S. PATENT DOCUMENTS

| | | | |
|---|---|---|---|
| 8,847,284 B2* | 9/2014 | Yang | H01L 27/0207 257/207 |
| 9,070,552 B1* | 6/2015 | Shah | H01L 27/0207 |
| 9,123,565 B2* | 9/2015 | Lu | H01L 27/092 |
| 9,190,405 B2* | 11/2015 | Chen | G06F 17/5068 |
| 9,306,570 B1* | 4/2016 | Sahu | H03K 19/017581 |
| 9,318,476 B2* | 4/2016 | Chen | H01L 27/0207 |
| 9,397,101 B2* | 7/2016 | Chintarlapalli Reddy | H01L 27/0924 |
| 9,483,600 B2* | 11/2016 | Bansal | H01L 27/0207 |
| 9,490,245 B1* | 11/2016 | Sahu | H01L 27/0266 |
| 9,502,351 B1* | 11/2016 | Sahu | H01L 23/5286 |
| 2014/0226418 A1* | 8/2014 | Ganesan | G11C 7/065 365/189.011 |

* cited by examiner

STANDARD CELL ARCHITECTURE FOR REDUCED LEAKAGE CURRENT AND IMPROVED DECOUPLING CAPACITANCE

BACKGROUND

Field

The present disclosure relates generally to a standard cell architecture, and more particularly, to a metal oxide semiconductor (MOS) integrated circuit (IC) standard cell architecture for a filler cell that reduces leakage current and improves decoupling capacitance.

Background

Standard cells of an IC implement digital logic. An application-specific IC (ASIC), such as a system-on-a-chip (SoC) device, may contain thousands to millions of standard cells. A typical MOS IC device includes a stack of sequentially formed layers. Each layer may be stacked or overlaid on a prior layer and patterned to form the shapes that define transistors (e.g., field effect transistors (FETs) and/or a fin-shaped FET (FinFET)) and connect the transistors into circuits.

As MOS IC devices are fabricated at smaller sizes, manufacturers are finding it more difficult to integrate larger numbers of standard cell devices on a single chip. If every cell in a MOS IC device is used for a logic function and requires inter-cell routing (e.g., 100% utilization), there may not be enough space for required inter-cell routing between the standard cells. In order to reduce utilization in a MOS IC device, engineering change order (ECO) cells, decoupling capacitor cells, and filler cells may be used. A utilization of around 70%-80% may provide enough space to allow for the requisite inter-cell routing between standard cells. Typically, a majority of the 20%-30% of non-utilization may be obtained through the use of filler cells, as filler cells have less current leakage than decoupling capacitor cells and provide some decoupling capacitance. Filler cells (e.g., rather than empty cells without any transistor patterning) may be necessary when the power rails and/or n-doped wells are formed continuous across the MOS IC device. An IC simulator may be inaccurate with estimating leakage of filler cells. There is currently a need for a filler cell that improves a leak current estimation in an IC simulator. Further, there is currently a need to reduce the leakage current of filler cells without significantly reducing the decoupling capacitance of filler cells.

SUMMARY

In an aspect of the disclosure, a standard cell IC may include a plurality of p-type MOS (pMOS) transistors. Each pMOS transistor of the plurality of pMOS transistors may have a pMOS transistor drain, a pMOS transistor source, and a pMOS transistor gate. Each pMOS transistor drain and pMOS transistor source of the plurality of pMOS transistors may be coupled to a first voltage source. Each pMOS transistor gate of the plurality of pMOS transistors may be formed by a pMOS gate interconnect of a plurality of pMOS gate interconnects. Each of the pMOS gate interconnects may extend in a first direction and may be coupled to the first voltage source. The standard cell IC may also include a plurality of n-type MOS (nMOS) transistors. Each nMOS transistor of the plurality of nMOS transistors may have an nMOS transistor drain, an nMOS transistor source, and an nMOS transistor gate. Each nMOS transistor drain and nMOS transistor source of the plurality of nMOS transistors may be coupled to a second voltage source lower than the first voltage source. Each nMOS transistor gate of the plurality of nMOS transistors may be formed by an nMOS gate interconnect of a plurality of nMOS gate interconnects. Each of the nMOS gate interconnects may extend in the first direction and may be coupled to the second voltage source.

In another aspect of the disclosure, a method of operation of a standard cell IC may include flowing a first current through a plurality of pMOS transistors. Each pMOS transistor of the plurality of pMOS transistors may have a pMOS transistor drain, a pMOS transistor source, and a pMOS transistor gate. Each pMOS transistor drain and pMOS transistor source of the plurality of pMOS transistors may be coupled to a first voltage source. Each pMOS transistor gate of the plurality of pMOS transistors may be formed by a pMOS gate interconnect of a plurality of pMOS gate interconnects. Each of the pMOS gate interconnects may extend in a first direction and may be coupled to the first voltage source. The method of operation may also include flowing a second current through a plurality of nMOS transistor. Each nMOS transistor of the plurality of nMOS transistors may have an nMOS transistor drain, an nMOS transistor source, and an nMOS transistor gate. Each nMOS transistor drain and nMOS transistor source of the plurality of nMOS transistors may be coupled to a second voltage source lower than the first voltage source. Each nMOS transistor gate of the plurality of nMOS transistors may be formed by an nMOS gate interconnect of a plurality of nMOS gate interconnects. Each of the nMOS gate interconnects may extend in the first direction and may be coupled to the second voltage source.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts. Apparatuses and methods will be described in the following detailed description and may be illustrated in the accompanying drawings by various blocks, modules, components, circuits, steps, processes, algorithms, elements, etc.

As MOS IC devices are fabricated at smaller sizes, manufacturers are finding it more difficult to integrate larger numbers of standard cell devices on a single chip. If every cell in a MOS IC device is used for a logic function and requires inter-cell routing (e.g., 100% utilization), there may not be enough space for required inter-cell routing between the standard cells. In order to reduce utilization in a MOS IC device, engineering change order (ECO) cells, decoupling capacitor cells, and filler cells may be used. A utilization of around 70%-80% may provide enough space to allow for the requisite inter-cell routing between standard cells. To obtain the 20%-30% of non-utilization, ECO cells may be placed as needed. In addition, decoupling capacitor cells may be placed to obtain a requisite decoupling capacitance. Further, remaining locations may be filled with filler cells. Typically, a majority of the 20%-30% of non-utilization may be obtained through the use of filler cells, as filler cells have less current leakage than decoupling capacitor cells and provide some decoupling capacitance. Filler cells (e.g., rather than empty cells without any transistor patterning) may be necessary when the power rails and/or n-doped wells are formed continuous across the MOS IC device.

Figure 1A:
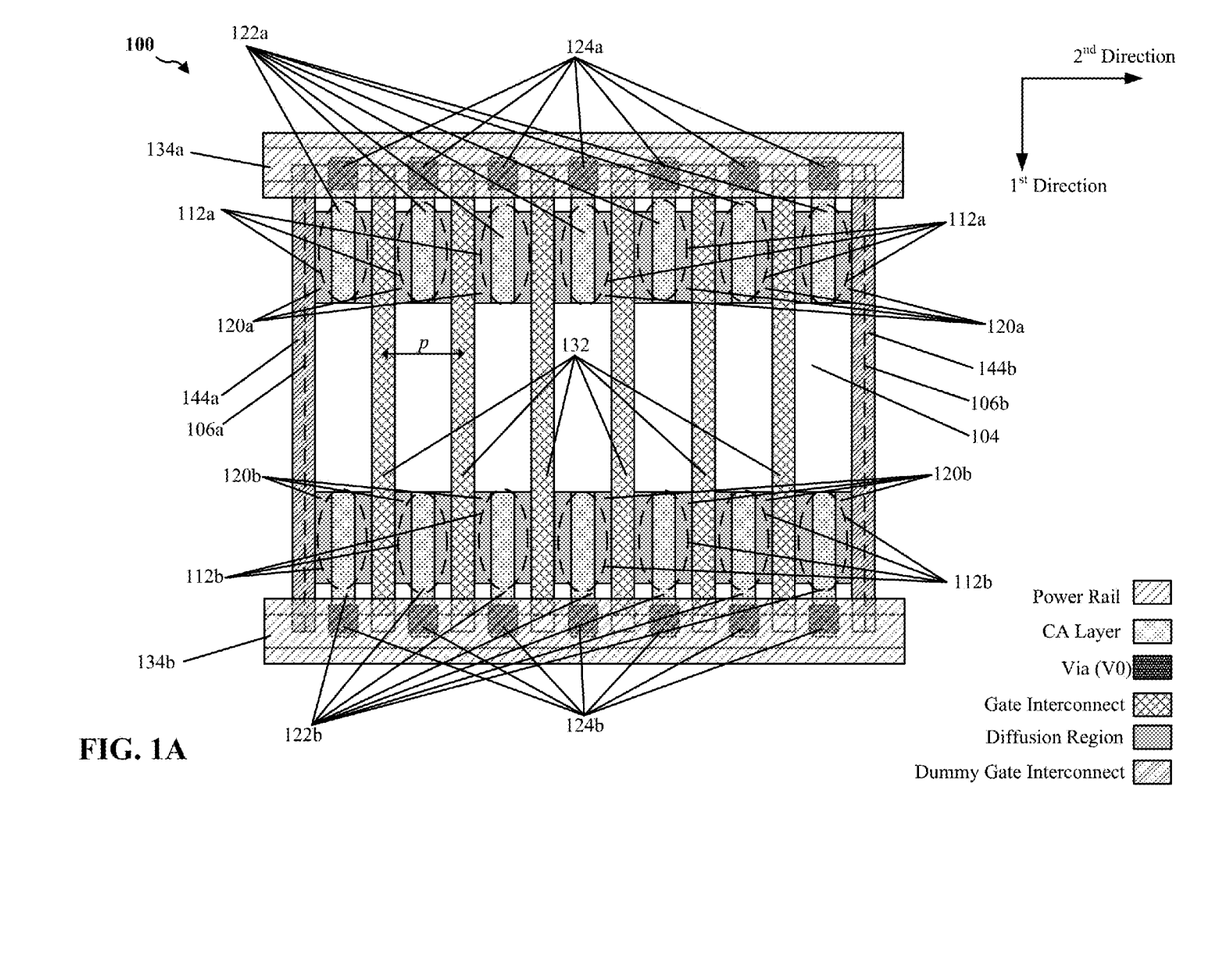
FIG. 1A is a diagram illustrating a plan view of an example filler cell.
Figure 1B:
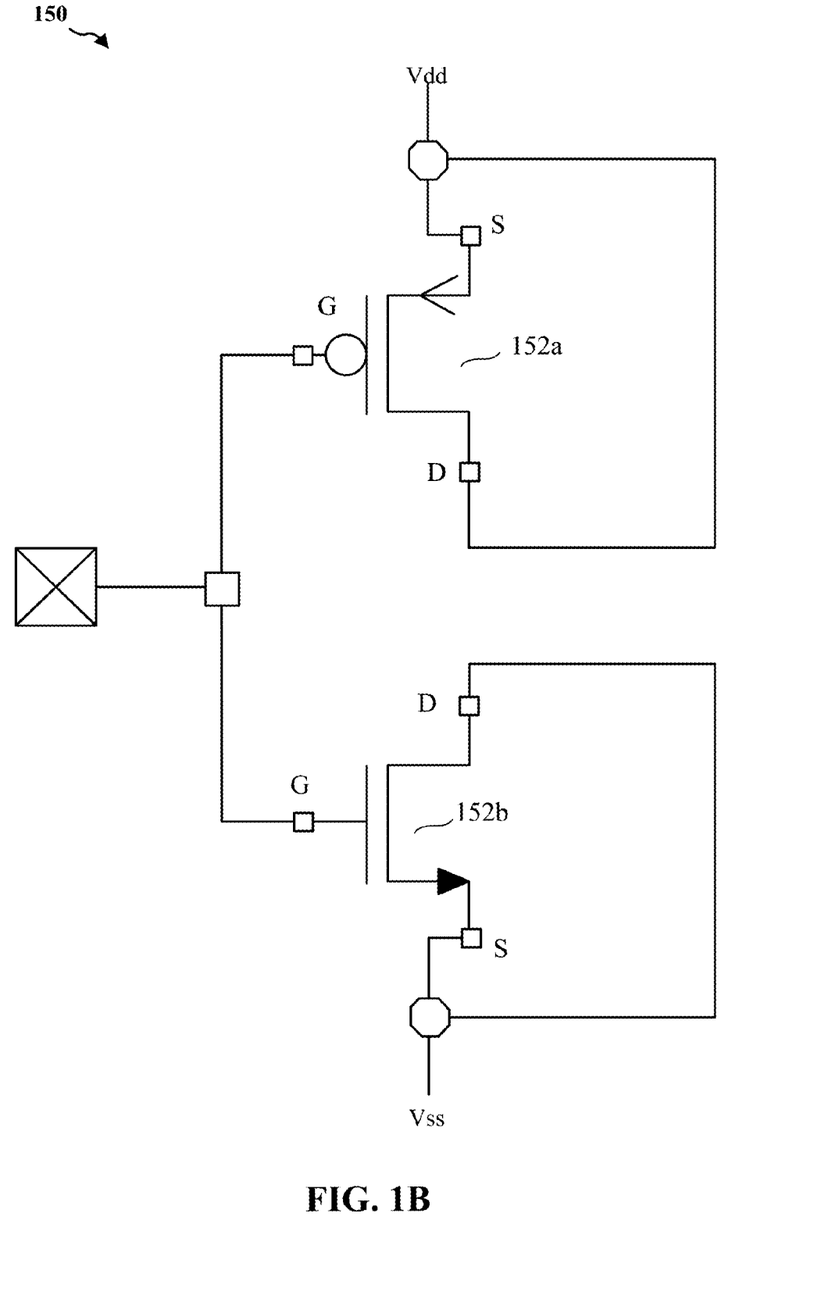
FIG. 1B is an example schematic diagram of the filler cell of FIG. 1A.

FIG. 1A is an example diagram illustrating a plan view of an example standard cell architecture of a filler cell 100. FIG. 1B is a schematic diagram 150 illustrating the source/drain/gate connections of the pMOS transistors (152a) and nMOS transistors (152b) of the filler cell 100 illustrated in FIG. 1A. The filler cell 100 may be formed on substrate 104 (e.g., silicon substrate). It should be understood that the example diagram of FIG. 1 is a representation of the various masks that may be used for fabricating the features of the filler cell 100. For example, each mask may correspond to various features that are to be configured in a particular layer (e.g., interconnects, vias, etc.) of the filler cell 100. Therefore, the example diagram illustrated in FIG. 1 concurrently shows a number of layers of the filler cell 100 in an overlaid manner for ease of illustration and understanding of the disclosure.

In the example configuration of FIG. 1A, a dummy gate interconnect 144a is formed over cell boundary 106a and another dummy gate interconnect 144b is formed over cell boundary 106b. In addition, floating gate interconnects 132 are formed between the dummy gate interconnects 144a, 144b. For example, each of the dummy gate interconnects 144a, 144b and floating gate interconnects 132 may be formed along the boundaries of each of the n grids (in FIG. 1, n=7). In the example illustrated in FIG. 1, each of the n grids has a width of pitch p and therefore the filler cell 100 has a width of approximately n*p. The filler cell 100 includes n (e.g., 7) gate interconnects, including n−1 (e.g., 6) gate interconnects 132, one half of a dummy gate interconnect 144a, and one half of a dummy gate interconnect 144b.

Still referring to FIG. 1, the dummy gate interconnects 144a, 144b and/or the floating gate interconnects 132 may be configured in a POLY layer. In some process technologies, the dummy gate interconnects 144a, 144b and/or the floating gate interconnects 132 may be formed of metal. However, in other process technologies, the dummy gate interconnects 144a, 144b and/or the floating gate interconnects 132 may be entirely polysilicon or may be polysilicon with a metal top layer. As indicated in the top right corner of FIG. 1, the dummy gate interconnects 144a, 144b and/or the floating gate interconnects 132 extend in a first direction.

Furthermore, to configure the gate interconnects in the filler cell 100 as floating gate interconnects 132, the floating gate interconnects 132 are not coupled to a voltage source. In addition, each of the pMOS source/drain regions 112a are coupled to the same voltage source 134a (e.g., $V_{dd}$), and each of the nMOS source/drain regions 112b are coupled to the same voltage source 134b (e.g., $V_{ss}$). For example, the pMOS source/drain regions 112a each include a diffusion region 120a, a metal diffusion contact A (CA) interconnect 122a, and a via (via V0) 124a that connect the pMOS source/drain regions 112a to the voltage source 134a. In addition, the nMOS source/drain regions 112b each include a diffusion region 120b, a CA interconnect 122b, and via V0 124b that connect the nMOS source/drain regions 112b to the voltage source 134b.

The potential of the floating gate interconnects 132 may be between $V_{dd}$ and $V_{ss}$.

Specifically, the gate interconnects 132 may be floating at a voltage that is approximately $(V_{dd}-V_{ss})/2+V_{ss}$. If $V_{ss}$ is ground, the gate interconnects 132 may be floating at a voltage that is approximately $V_{dd}/2$. The floating gate interconnects 132 at a voltage that is approximately $V_{dd}/2$ (assuming $V_{ss}$ is ground) creates a current leakage between each transistor gate and each transistor bulk/body (e.g., the substrate 104). During simulations of the IC, a simulator may assume the transistor gate is at a voltage that is either $V_{dd}$ or $V_{ss}$, and therefore does not make a good estimate of the current leakage. In exemplary filler cells as discussed infra with respect to FIGS. 2-4, gate interconnects 232, 332, 432 may be tied to either $V_{dd}$ or $V_{ss}$, and therefore the simulator, which assumes that the voltage on the gate interconnects 132 is either $V_{dd}$ or $V_{ss}$, may be more accurate with respect to estimating leakage current.

Figure 2:
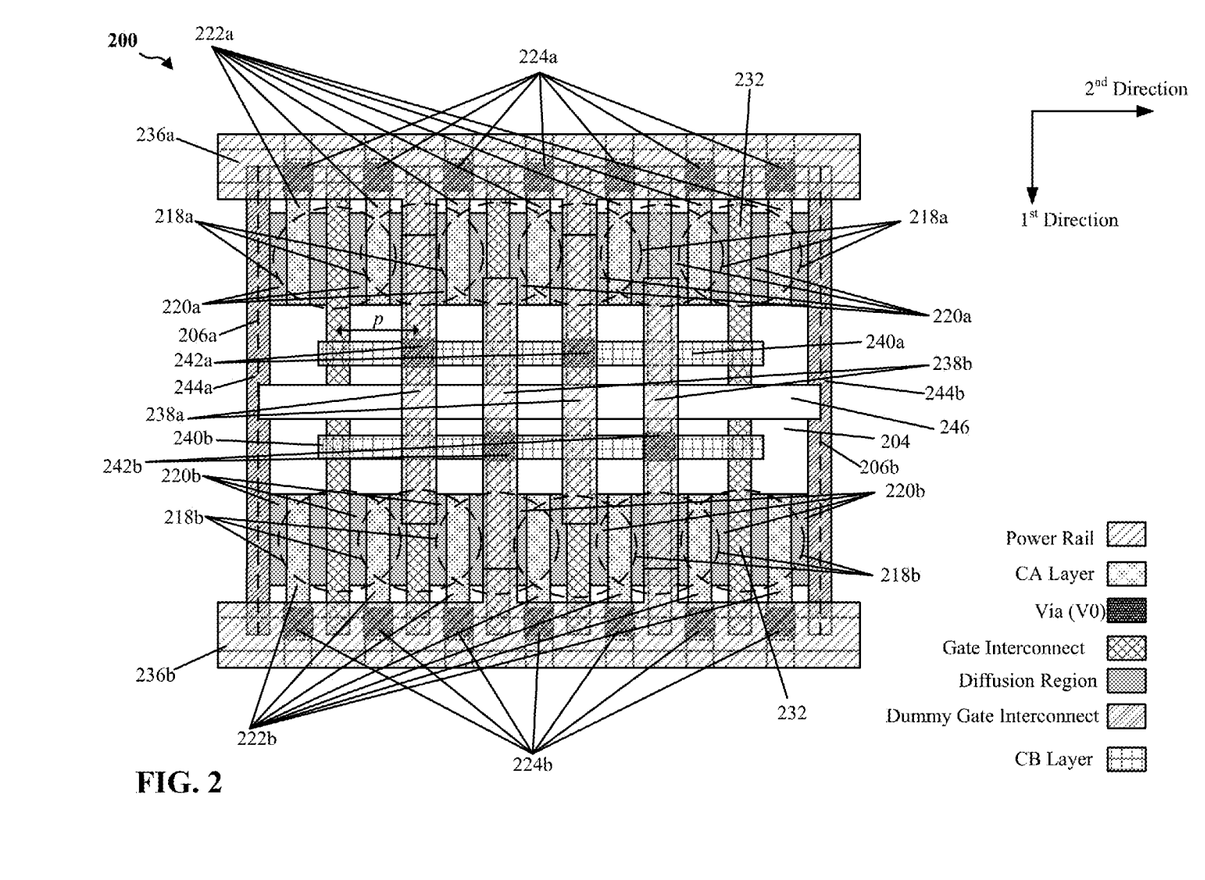
FIG. 2 is a diagram illustrating a plan view of an exemplary filler cell with a standard cell architecture that reduces leakage current.

FIG. 2 is an exemplary diagram illustrating a plan view of a standard cell architecture of a filler cell 200. For example, the filler cell 200 may be formed on a substrate 204 (e.g., silicon substrate). It should be understood that the example diagram of FIG. 2 is a representation of the various masks that may be used for fabricating the features of the filler cell 200. For example, each mask may correspond to various features that are to be configured in a particular layer (e.g., interconnects, vias, etc.) of the filler cell 200. Therefore, the example diagram illustrated in FIG. 2 concurrently shows a number of layers of the filler cell 200 in an overlaid manner for ease of illustration and understanding of the disclosure.

In the exemplary configuration of FIG. 2, the filler cell 200 includes a dummy gate interconnect 244a formed over the first cell boundary 206a and another dummy gate interconnect 244b formed over the second cell boundary 206b. For example, a first half of each of the dummy gate interconnects 244a, 244b may be located in the filler cell 200, and second half of each of the dummy gate interconnects 244a, 244b may be located in standard cells adjacent to the first cell boundary 206a and the second cell boundary 206b.

In addition, the filler cell 200 includes pMOS transistors 218a and nMOS transistors 218b. The pMOS transistors 218a and the nMOS transistors 218b may be made up of gate interconnects 232 (only one is labeled but six gate interconnects 232 are shown) and source/drain regions on either side of the gate interconnects 232. For example, the portions of the gate interconnects 232 adjacent to the source/drain regions located in the pMOS transistors 218a form gates of the pMOS transistors 218a. Similarly, the portions of the gate interconnects 232 adjacent to the source/drain regions located in the nMOS transistors 218b form gates of the nMOS transistors 218b.

Each of the dummy gate interconnects 244a, 244b and the gate interconnects 232 may be along the boundaries of each of the n grids (in FIG. 2, n=7). In the example illustrated in FIG. 2, each of the n grids has a width of pitch p and therefore the filler cell 200 has a width of approximately n*p. The filler cell 200 includes n (e.g., 7) gate interconnects, including n−1 (e.g., 6) gate interconnects 232, one half of a dummy gate interconnect 244a, and one half of a dummy gate interconnect 244b.

Still referring to FIG. 2, the dummy gate interconnects 244a, 244b and/or the gate interconnects 232 may be configured in a POLY layer. In some process technologies, the dummy gate interconnects 244a, 244b and/or the gate interconnects 232 may be formed of metal. However, in other process technologies, the dummy gate interconnects 244a, 244b and/or the gate interconnects 232 may be entirely polysilicon or may be polysilicon with a metal top layer. As indicated in the top right corner of FIG. 2, the dummy gate interconnects 244a, 244b and the gate interconnects 232 extend in a first direction.

Furthermore, each of the source/drain regions of the pMOS transistors 218a are coupled to the same voltage source 236a (e.g., $V_{dd}$). For example, the source/drain regions of the pMOS transistors 218a each include a diffusion region 220a, a CA interconnect 222a, and a via V0 224a that connect the source/drain regions of the pMOS transistors 218a to the voltage source 236a.

In addition, each of the source/drain regions of the nMOS transistors 218b are coupled to the same voltage source 236b (e.g., $V_{ss}$). For example, the source/drain regions of the nMOS transistors 218b each include a diffusion region 220b, a CA interconnect 222b, and via V0 224b that connect the source/drain regions of the nMOS transistors 218b to the voltage source 236b.

The gate interconnects 232 may be physically cut 246. The physical cut 246 may include a physical cut of the gate interconnects 232 and the portion of the dummy gate interconnects 244a, 244b located in the filler cell 200. In other words, the physical cut 246 may not extend into the standard cells adjacent to the first cell boundary 206a and the second cell boundary 206b.

In addition, to place the pMOS transistors 218a in an off-state, certain gate interconnects 232 of the pMOS transistors 218a may be connected to voltage source 236a. For example, a metal POLY contact B (CB) interconnect 240a and a via V0 242a may be formed on certain gate interconnects 232 and connected to metal layer one (M1) interconnects 238a that extend along the gate interconnects 232.

Furthermore, to place the nMOS transistors 218b in an off-state, certain gate interconnects 232 of the nMOS transistors 218b may be connected to voltage source 236b. For example, a CB interconnect 240b and a via V0 242b may be formed on certain gate interconnects 232 and connected to M1 interconnects 238b that extend along the gate interconnects 232. Each of the CB interconnects 240a, 240b may extend in a second direction as indicated in the top right corner of FIG. 2.

Because the gate interconnects 232 are tied to either $V_{dd}$ or $V_{ss}$, simulations by an IC simulator may be more accurate with respect to leakage current estimation than with the filler cell 100 of FIG. 1. Further, the filler cell 200 may have a reduced leakage current with negligible decrease in decoupling capacitance as compared to the filler cell 100 illustrated in FIG. 1.

Figure 3:
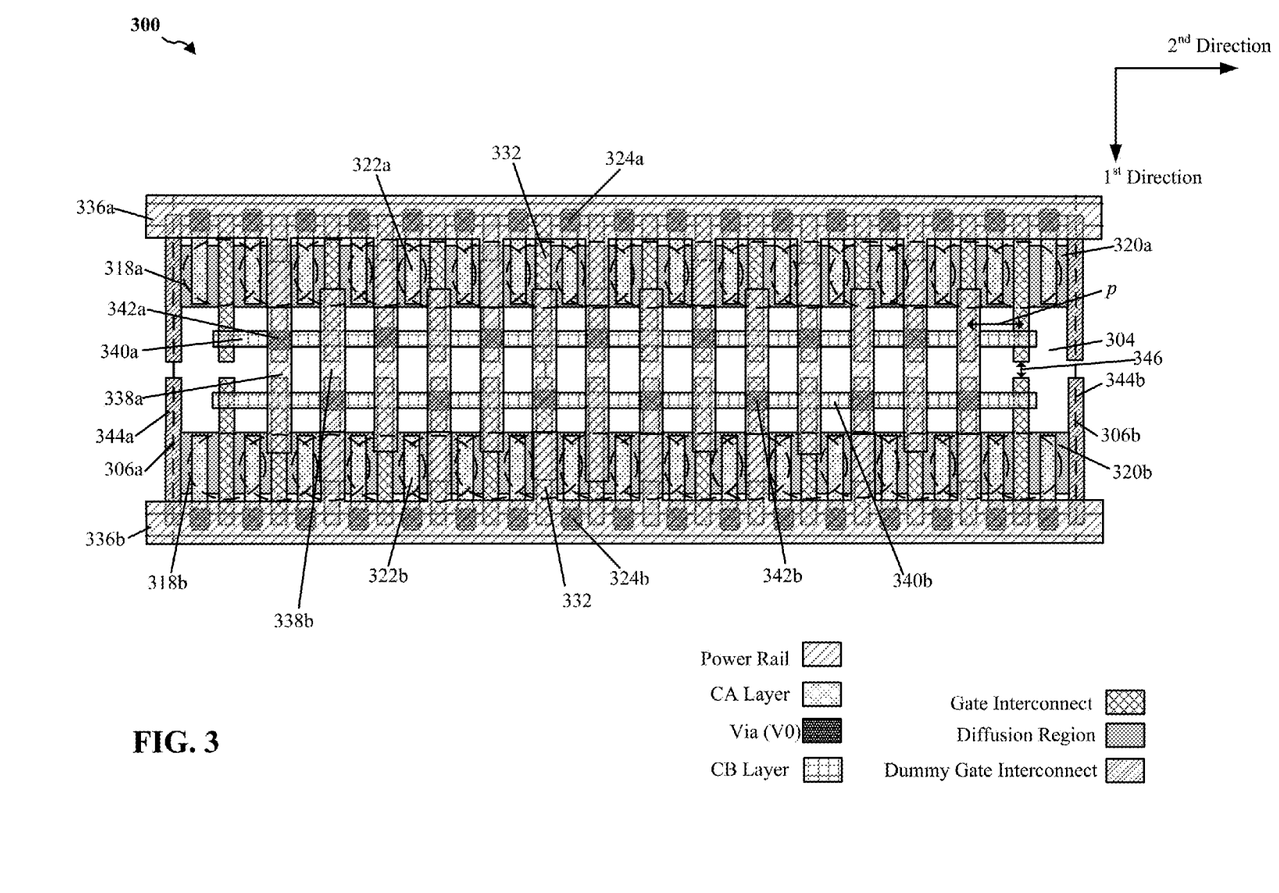
FIG. 3 is a diagram illustrating a plan view of an exemplary filler cell with a standard cell architecture that reduces leakage current.

FIG. 3 is an exemplary diagram illustrating a plan view of a standard cell architecture of a filler cell 300. For example, the filler cell 300 may be formed on a substrate 304 (e.g., silicon substrate). It should be understood that the example diagram of FIG. 3 is a representation of the various masks that may be used for fabricating the features of the filler cell 300. For example, each mask may correspond to various features that are to be configured in a particular layer (e.g., interconnects, vias, etc.) of the filler cell 300. Therefore, the example diagram illustrated in FIG. 3 concurrently shows a number of layers of the filler cell 300 in an overlaid manner for ease of illustration and understanding of the disclosure.

In the exemplary configuration of FIG. 3, the filler cell 300 includes a dummy gate interconnect 344a formed a first cell boundary 306a and another dummy gate interconnect 344b formed over a second cell boundary 306b. For example, a first half of each of the dummy gate interconnects 344a, 344b may be located in the filler cell 300, and second half of each of the dummy gate interconnects 344a, 344b may be located in standard cells adjacent to the first cell boundary 306a and the second cell boundary 306b.

In addition, the filler cell 300 includes pMOS transistors 318a and nMOS transistors 318b. The pMOS transistors 318a and the nMOS transistors 318b may be made up of gate interconnects 332 and source/drain regions formed on either side of the gate interconnects 332. For example, the portions of the gate interconnects 332 adjacent to the source/drain regions located in the pMOS transistors 318a form gates of the pMOS transistors 318a. Similarly, the portions of the gate interconnects 332 adjacent to the source/drain regions located in the nMOS transistors 318b form gates of the nMOS transistors 318b.

Each of the dummy gate interconnects 344a, 344b and the gate interconnects 332 may be along the boundaries of each of the n grids (in FIG. 3, n=17). In the example illustrated in FIG. 3, each of the n grids has a width of pitch p and therefore the filler cell 300 has a width of approximately n*p. The filler cell 300 includes n (e.g., 17) gate interconnects, including n−1 (e.g., 16) gate interconnects 332, one half of dummy gate interconnect 344a, and one half of dummy gate interconnect 344b.

Still referring to FIG. 3, the dummy gate interconnects 344a, 344b and/or the gate interconnects 332 may be configured in a POLY layer. In some process technologies, the dummy gate interconnects 344a, 344b and/or the gate interconnects 332 may be formed of metal. However, in other process technologies, the dummy gate interconnects 344a, 344b and/or the gate interconnects 332 may be entirely polysilicon or may be polysilicon with a metal top layer. As indicated in the top right corner of FIG. 3, the dummy gate interconnects 344a, 344b and the gate interconnects 332 extend in a first direction.

Furthermore, each of the source/drain regions of the pMOS transistors 318a are coupled to the same voltage source 336a (e.g., $V_{dd}$). For example, the source/drain regions in the pMOS transistors 318a each include a diffusion region 320a, a CA interconnect 322a, and a via V0 324a that connect the source/drain regions of the pMOS transistors 318a to the voltage source 336a.

In addition, each of the source/drain regions of the nMOS transistors 318b are coupled to the same voltage source 336b (e.g., $V_{ss}$). For example, the source/drain regions of the nMOS transistors 318b each include a diffusion region 320b, a CA interconnect 322b, and via V0 324b that connect the source/drain regions of the nMOS transistors 318b to the voltage source 336b.

The gate interconnects 332 may be physically cut 346. The physical cut 346 may include a physical cut of the gate interconnects 332 and an entirety of each of the dummy gate interconnects 344a, 344b. In other words, the physical cut 346 may extend into the standard cells adjacent to the first cell boundary 306a and the second cell boundary 306b.

In addition, to place the pMOS transistors 318a in an off-state, certain gate interconnects 332 may be connected to voltage source 336a. For example, a CB interconnect 340a and a via V0 342a may be formed on the gate interconnects 332 and connected to M1 layer interconnects 338a that extend along certain gate interconnects 332.

Furthermore, to place the nMOS transistors 318b in an off-state, certain gate interconnects 332 may be connected to voltage source 336b. For example, a CB interconnect 340b and a via V0 342b may be formed on the gate interconnects 332 and connected to M1 layer interconnects 338b that extend along the gate interconnects 332. Each of the CB interconnects 340a, 340b may extend in a second direction as indicated in the top right corner of FIG. 3.

Because the gate interconnects 332 are tied to either $V_{dd}$ or $V_{ss}$, simulations by an IC simulator may be more accurate with respect to leakage current estimation than with the filler cell 100 of FIG. 1. Further, the filler cell 300 may have a reduced leakage current with negligible decrease in decoupling capacitance as compared to the filler cell 100 illustrated in FIG. 1.

Figure 4:
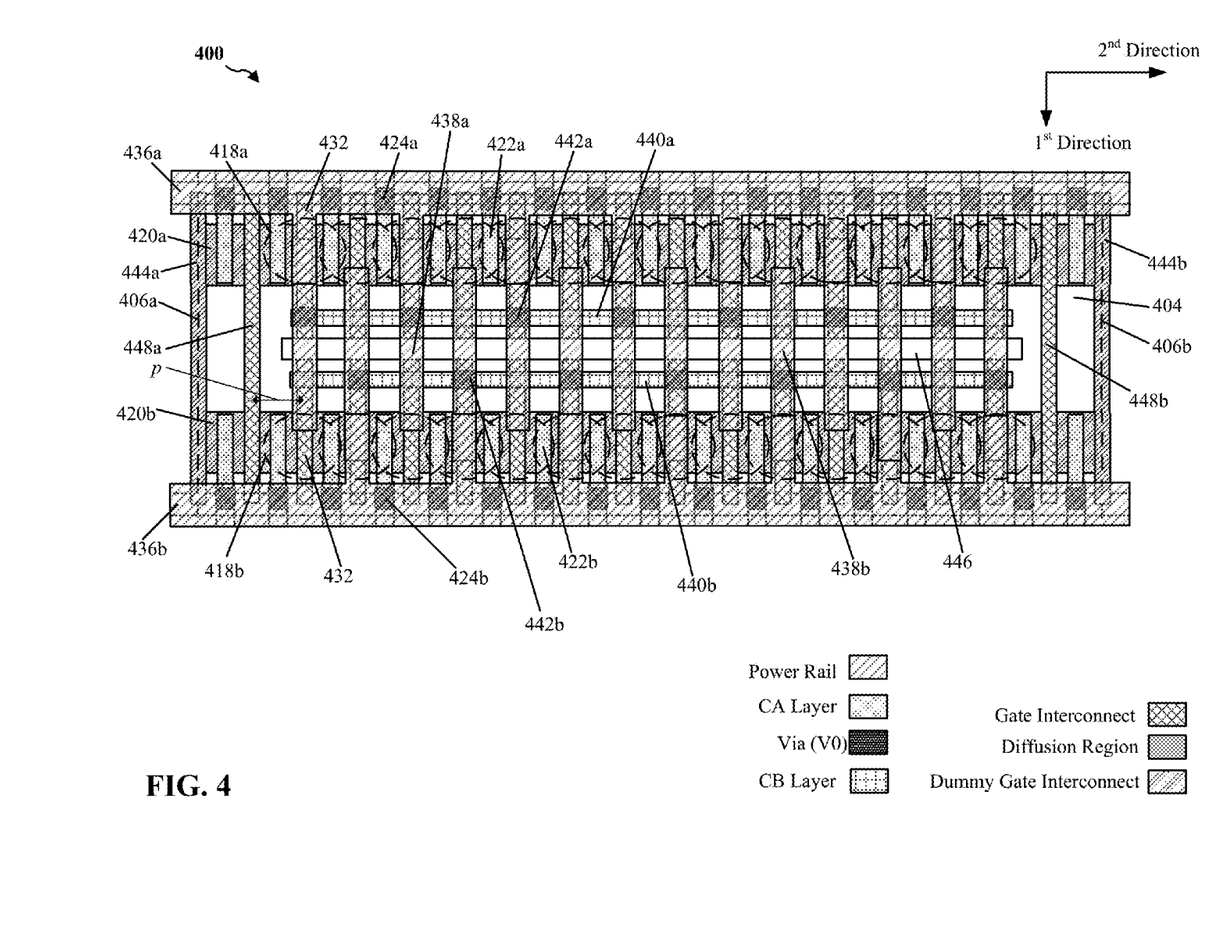
FIG. 4 is a diagram illustrating a plan view of an exemplary filler cell with a standard cell architecture that reduces leakage current.

FIG. 4 is an exemplary diagram illustrating a plan view of a standard cell architecture of a filler cell 400. For example, the filler cell 400 may be formed on substrate 404 (e.g., silicon substrate). It should be understood that the example diagram of FIG. 4 is a representation of the various masks that may be used for fabricating the features of the filler cell 400. For example, each mask may correspond to various features that are to be configured in a particular layer (e.g., interconnects, vias, etc.) of the filler cell 400. Therefore, the example diagram illustrated in FIG. 4 concurrently shows a number of layers of the filler cell 400 in an overlaid manner for ease of illustration and understanding of the disclosure.

In the exemplary configuration of FIG. 4, the filler cell 400 includes a dummy gate interconnect 444a formed over a first cell boundary 406a and another dummy gate interconnect 444b formed over a second cell boundary 406b. For example, a first half of each of the dummy gate interconnects 444a, 444b may be located in the filler cell 400, and second half of each of the dummy gate interconnects 444a, 444b may be located in standard cells adjacent to the first cell boundary 406a and the second cell boundary 406b. In addition, to configure certain gate interconnects in the filler cell 400 as floating gate interconnects 448a, 448b, the floating gate interconnects 448a, 448b are not coupled to a voltage source.

Still further, the filler cell 400 includes pMOS transistors 418a and nMOS transistors 418b. The pMOS transistors 418a and the nMOS transistors 418b may be made up of gate interconnects 432 and source/drain regions located on either sides of the gate interconnects 432. For example, the portions of the gate interconnects 432 adjacent to the source/drain regions located in the pMOS transistors 418a form gates of the pMOS transistors 418a. Similarly, the portions of the gate interconnects 432 adjacent to the source/drain regions located in the nMOS transistors 418b form gates of the nMOS transistors 418b.

Each of the dummy gate interconnects 444a, 444b, the floating gate interconnects 448a, 448b, and the gate interconnects 432 may be formed along the boundaries of each of the n grids (in FIG. 4, n=17). In the example illustrated in FIG. 4, each of the n grids has a width of pitch p and therefore the filler cell 400 has a width of approximately n*p. The filler cell 400 includes n (e.g., 17) gate interconnects, including n−3 (e.g., 14) gate interconnects 432, n−15 (e.g., 2) floating gate interconnects 448a, 448b, one half of dummy gate interconnect 444a, and one half of dummy gate interconnect 444b.

Still referring to FIG. 4, the dummy gate interconnects 444a, 444b, the floating gate interconnects 448a, 448b, and/or the gate interconnects 432 may be configured in a POLY layer. In some process technologies, the dummy gate interconnects 444a, 444b, the floating gate interconnects 448a, 448b, and/or the gate interconnects 432 may be formed of metal. However, in other process technologies, the dummy gate interconnects 444a, 444b, the floating gate interconnects 448, 448b, and/or the gate interconnects 432 may be entirely polysilicon or may be polysilicon with a metal top layer. As indicated in the top right corner of FIG. 4, the dummy gate interconnects 444a, 444b, the floating gate interconnects 448a, 448b, and/or the gate interconnects 432 extend in a first direction.

Furthermore, each of the source/drain regions of the pMOS transistors 418a are coupled to the same voltage source 436a (e.g., $V_{dd}$). For example, the source/drain regions of the pMOS transistors 418a each include a diffusion region 420a, a CA interconnect 422a, and a via V0 424a that connect the source/drain regions of the pMOS transistors 418a to the voltage source 436a.

In addition, each of the source/drain regions of the nMOS transistors 418b are coupled to the same voltage source 436b (e.g., $V_{ss}$). For example, the source/drain regions of the nMOS transistors 418b each include a diffusion region 420b, a CA interconnect 422b, and a via V0 424b that connect the source/drain regions of the nMOS transistors 418b to the voltage source 436b.

The gate interconnects 432 may be physically cut 446. In addition, to place the pMOS transistors 418a in an off-state, certain gate interconnects 432 may be connected to voltage source 436a. For example, a CB interconnect 440a and a via V0 442a may be formed on certain gate interconnects 432 and connected to M1 layer interconnects 438a that extend along certain gate interconnects 432.

Furthermore, to place the nMOS transistors 418b in an off-state, certain gate interconnects 432 may be connected to voltage source 436b. For example, a CB interconnect 440b and a via V0 442b may be formed on certain gate interconnects 432 and connected to M1 layer interconnects 438b that extend along certain gate interconnects 432. Each of the CB interconnects 440a, 440b may extend in a second direction as indicated in the top right corner of FIG. 4.

Because the gate interconnects 432 are tied to either $V_{dd}$ or $V_{ss}$, simulations by an IC simulator may be more accurate with respect to leakage current estimation than with the filler cell 100 of FIG. 1. Further, the filler cell 400 may have a reduced leakage current with negligible decrease in decoupling capacitance as compared to the filler cell 100 illustrated in FIG. 1.

Figure 5:
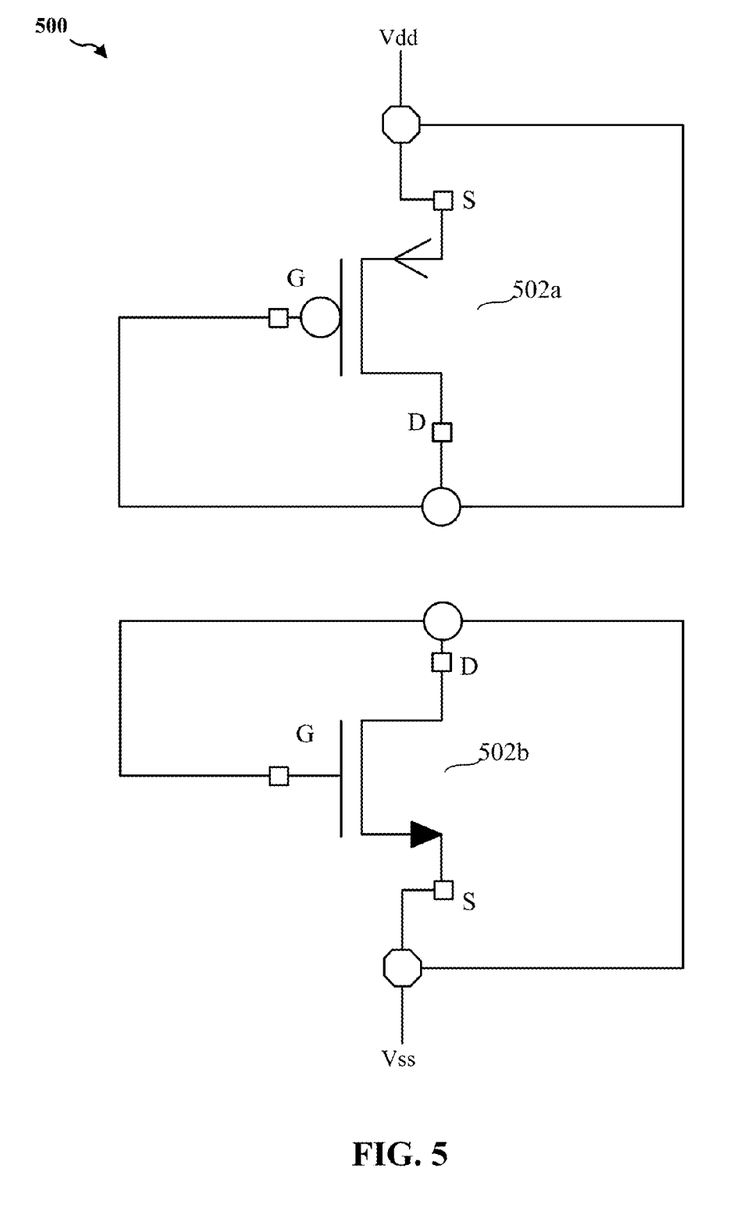
FIG. 5 is an exemplary schematic diagram of the filler cells of FIGS. 2-4.

FIG. 5 is a schematic diagram 500 illustrating the source/drain/gate connections for the pMOS transistors (502a) 218a, 318a, 418a and the nMOS transistors (502b) 218b, 318b, 418b. As shown in the diagram the source/drain/gate of the pMOS transistors 502a are all connected to $V_{dd}$. In addition, the source/drain/gate of the nMOS transistors 502b are all connected to $V_{ss}$.

Figure 6:
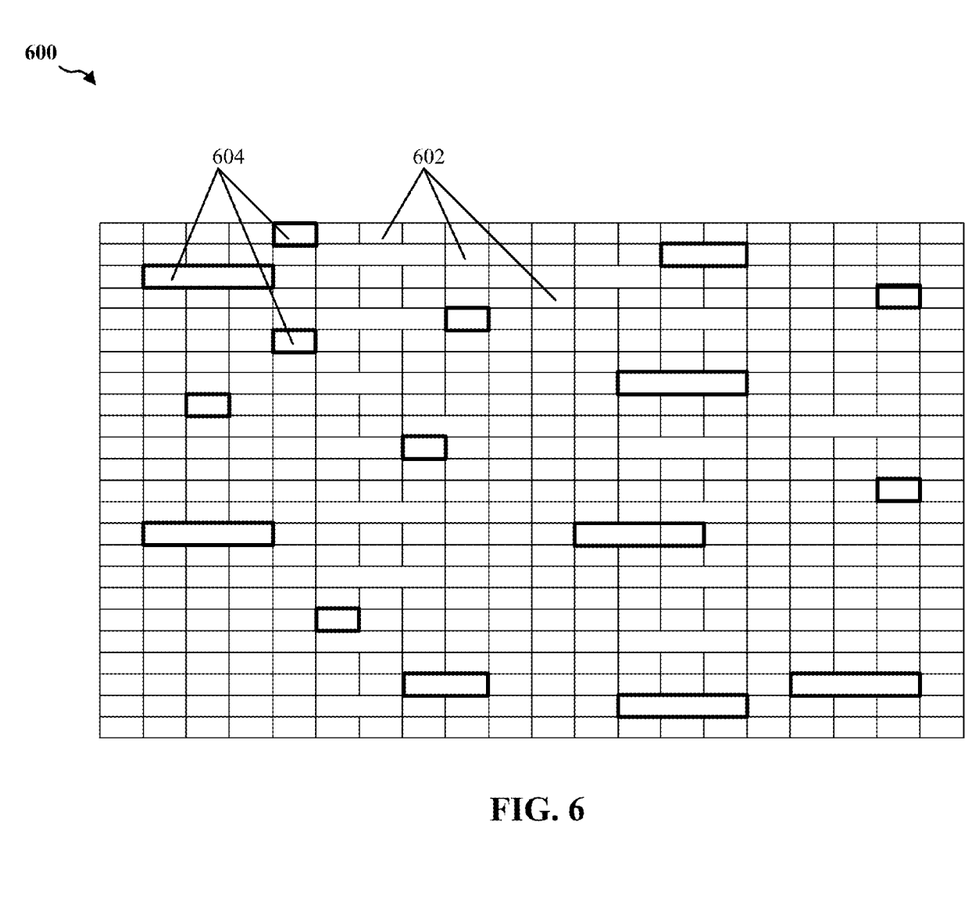
FIG. 6 is a diagram of a MOS IC device including standard cells and filler cells.

FIG. 6 is a diagram 600 illustrating a MOS IC device including a plurality of standard cells 602 and a plurality of filler cells 604. The filler cells 604 may be used to decrease utilization to improve inter-cell routing and/or to provide additional electrical isolation between standard cells 602. The filler cells 604 may provide some decoupling capacitance within the MOS IC device 600.

In one aspect of the disclosure, a standard cell IC includes a plurality of pMOS transistors (218a, 318a, 418a). In one aspect, each pMOS transistor (218a, 318a, 418a) of the plurality of pMOS transistors (218a, 318a, 418a) include a pMOS transistor drain (located on one side of each of the gate interconnects 232, 332, 432 located in the pMOS transistors 218a, 318a, 418a), a pMOS transistor source (located on the other side of each of the gate interconnects 232, 332, 432 located in the pMOS transistors 218a, 318a, 418a), and a pMOS transistor gate (the portions of the gate interconnects 232, 332, 432 located in pMOS transistors 218a, 318a, 418a). In a further aspect, each pMOS transistor drain (located on one side of each of the gate interconnects 232, 332, 432 located in the pMOS transistors 218a, 318a, 418a) and pMOS transistor source (located on the other side of each of the gate interconnects 232, 332, 432 located in the pMOS transistors 218a, 318a, 418a) of the plurality of pMOS transistors (218a, 318a, 418a) are coupled to a first voltage source (236a, 336a, 436a). In another aspect, each pMOS transistor gate (the portions of the gate interconnects 232, 332, 432 located in the pMOS transistors 218a, 318a, 418a) of the plurality of pMOS transistors (218a, 318a, 418a) may be formed by a pMOS gate interconnect (232, 332, 432) of a plurality of pMOS gate interconnects (232, 332, 432). In a further aspect, each of the pMOS gate interconnects (232, 332, 432) extend in a first direction and are coupled to the first voltage source (236a, 336a, 436a).

In another aspect, the standard cell IC includes a plurality of nMOS transistors (218b, 318b, 418b). In a further aspect, each nMOS transistor (218b, 318b, 418b) of the plurality of nMOS transistors (218b, 318b, 418b) includes an nMOS transistor drain (located on one side of each of the gate interconnects 232, 332, 432 located in the nMOS transistors 218b, 318b, 418b), an nMOS transistor source (located on the other side of each of the gate interconnects 232, 332, 432 located in the nMOS transistors 218b, 318b, 418b), and an nMOS transistor gate (the portions of the gate interconnects 232, 332, 432 located in the nMOS transistors 218b, 318b, 418b). Still further, each nMOS transistor drain (located on one side of each of the gate interconnects 232, 332, 432 located in the nMOS transistors 218b, 318b, 418b) and nMOS transistor source (located on the other side of each of the gate interconnects 232, 332, 432 located in the nMOS transistors 218b, 318b, 418b) of the plurality of nMOS transistors (218b, 318b, 418b) is coupled to a second voltage source (236b, 336b, 436b) lower than the first voltage source (236a, 336a, 436a). Still further, each nMOS transistor gate (the portions of the gate interconnects 232, 332, 432 located in the nMOS transistors 218b, 318b, 418b) of the plurality of nMOS transistors (218b, 318b, 418b) is formed by an nMOS gate interconnect (232, 332, 432) of a plurality of nMOS gate interconnects (232, 332, 432). In addition, each of the nMOS gate interconnects (232, 332, 432) extend in the first direction and are coupled to the second voltage source (236b, 336b, 436b).

In a further aspect, the standard cell IC further includes a first contact interconnect (240a, 340a, 440a) extend in a second direction orthogonal to the first direction and couple the pMOS gate interconnects (232, 332, 432) together. The first contact interconnect (240a, 340a, 440a) is coupled to the first voltage source (236a, 336a, 436a). Still further, a second contact interconnect (240b, 340b, 440b) extends in the second direction and coupling the nMOS gate interconnects (232, 332, 432) together. In another aspect, the second contact interconnect (240b, 340b, 440b) is coupled to the second voltage source (236b, 336b, 436b).

In another aspect, each pMOS gate interconnect (the portions of the gate interconnects 232, 332, 432 located in the pMOS transistors 218a, 318a, 418a) of the pMOS gate interconnects (the portions of the gate interconnects 232, 332, 432 located in the pMOS transistors 218a, 318a, 418a) is separated (246, 346, 446) from and collinear with one nMOS gate interconnect (the portions of the gate interconnects 232, 332, 432 located in the nMOS transistors 218b, 318b, 418b) of the nMOS gate interconnects (the portions of the gate interconnects 232, 332, 432 located in the nMOS transistors 218b, 318b, 418b) in the first direction.

Further still, the standard cell IC has n grids with pitch p between the grids, and a width of approximately n*p. In an aspect, the grids extend in the first direction, and the plurality of pMOS transistors (218a, 318a) comprise n−1 transistors and the plurality of nMOS transistors (218b, 318b) comprise n−1 transistors.

In another aspect, the plurality of pMOS transistors (418a) comprise n−3 transistors and the plurality of nMOS transistors (418b) comprise n−3 transistors. Still further, the standard cell IC includes a first dummy gate interconnect (448a) that is adjacent a first side (406a) of the standard cell IC and that extends across the standard cell IC in the first direction. In addition, the first dummy gate (448a) is floating. Still further, the standard cell IC includes a second dummy gate interconnect (448b) that is adjacent a second side (406b) of the standard cell IC and that extends across the standard cell IC in the first direction. Still further, the second dummy gate (448b) is floating.

In yet a further aspect, the first contact interconnect (440a) and the second contact interconnect (440b) extend in the second direction between the first dummy gate interconnect (448a) and the second dummy gate interconnect (448b).

Figure 7:
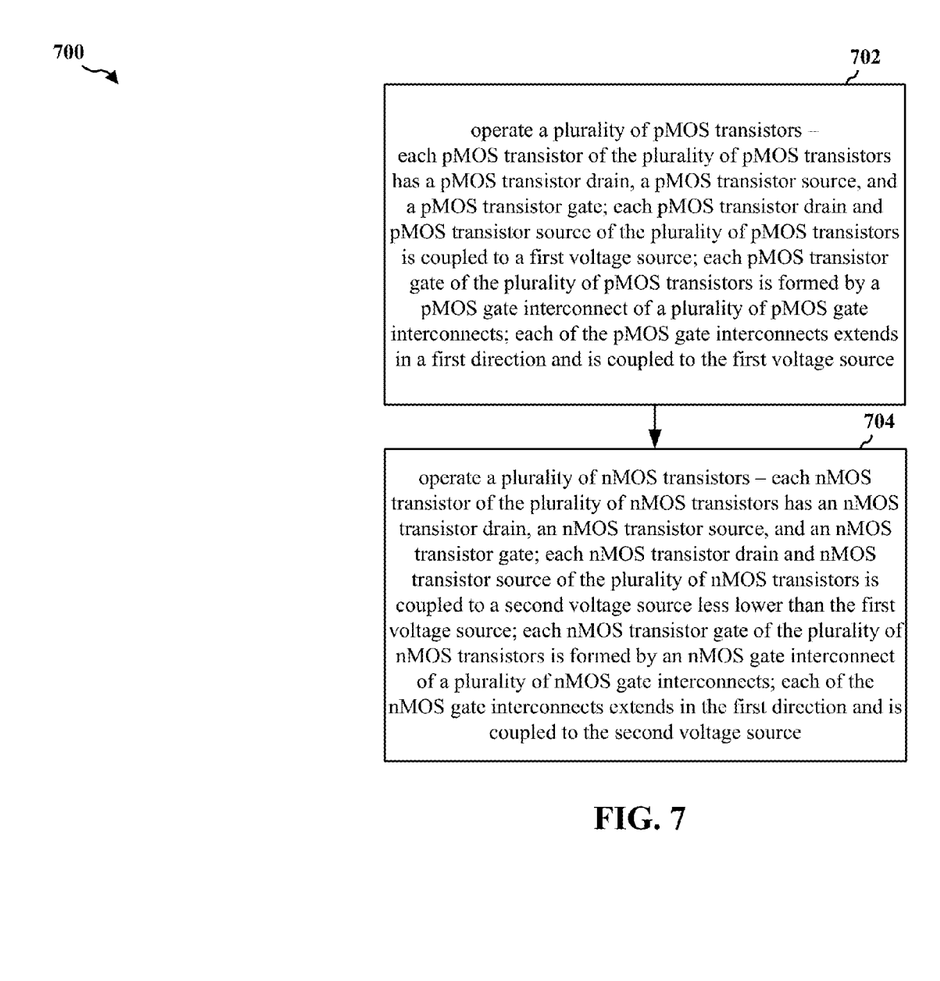
FIG. 7 is a flow chart of an exemplary method.

FIG. 7 is a flow chart 700 of an exemplary method. The exemplary method is a method of operation of a standard cell IC.

At 702, a plurality of pMOS transistors are operated. In an aspect, each pMOS transistor of the plurality of pMOS transistors has a pMOS transistor drain, a pMOS transistor source, and a pMOS transistor gate. In another aspect, each pMOS transistor drain and pMOS transistor source of the plurality of pMOS transistors are coupled to a first voltage source. In a further aspect, each pMOS transistor gate of the plurality of pMOS transistors are formed by a pMOS gate interconnect of a plurality of pMOS gate interconnects. In still another aspect, each of the pMOS gate interconnects extend in a first direction and is coupled to the first voltage source.

At 704, a plurality of nMOS transistors are operated. In an aspect, each nMOS transistor of the plurality of nMOS transistors have an nMOS transistor drain, an nMOS transistor source, and an nMOS transistor gate. In another aspect, each nMOS transistor drain and nMOS transistor source of the plurality of nMOS transistors are coupled to a second voltage source lower than the first voltage source. In a further aspect, each nMOS transistor gate of the plurality of nMOS transistors is formed by an nMOS gate interconnect of a plurality of nMOS gate interconnects. In yet another aspect, each of the nMOS gate interconnects extends in the first direction and is coupled to the second voltage source.

The standard cell IC further includes first means for operating a plurality of pMOS transistors. In an aspect, each pMOS transistor of the plurality of pMOS transistors has a pMOS transistor drain, a pMOS transistor source, and a pMOS transistor gate. In another aspect, each pMOS transistor drain and pMOS transistor source of the plurality of pMOS transistors is coupled to a first voltage source. In a further aspect, each pMOS transistor gate of the plurality of pMOS transistors is formed by a pMOS gate interconnect of a plurality of pMOS gate interconnects. In still another aspect, each of the pMOS gate interconnects extends in a first direction and is coupled to the first voltage source. The first means for operating a plurality of pMOS transistors includes the plurality of pMOS transistors in which each pMOS transistor drain and pMOS transistor source is coupled to a first voltage source. In addition, each pMOS transistor gate is formed by a pMOS gate interconnect of a plurality of pMOS gate interconnects. Further, each of the pMOS gate interconnects extends in a first direction and is coupled to the first voltage source The standard cell IC further includes second means for operating a plurality of nMOS transistors. In an aspect, each nMOS transistor of the plurality of nMOS transistors has an nMOS transistor drain, an nMOS transistor source, and an nMOS transistor gate. In another aspect, each nMOS transistor drain and nMOS transistor source of the plurality of nMOS transistors is coupled to a second voltage source lower than the first voltage source. In yet another aspect, each nMOS transistor gate of the plurality of nMOS transistors is formed by an nMOS gate interconnect of a plurality of nMOS gate interconnects. Further still, each of the nMOS gate interconnects extends in the first direction and is coupled to the second voltage source. The second means for operating a plurality of nMOS transistors includes the plurality of nMOS transistors in which each nMOS transistor drain and nMOS transistor source of the plurality of nMOS transistors is coupled to a second voltage source lower than the first voltage source. In addition, each nMOS transistor gate is formed by an nMOS gate interconnect of a plurality of nMOS gate interconnects. Further, each of the nMOS gate interconnects extends in the first direction and is coupled to the second voltage source.

During simulations of an IC that includes the filler cell 100 illustrated in FIG. 1A and represented by the schematic diagram 150 of FIG. 1B, a simulator may assume the transistor gate is at a voltage that is either $V_{dd}$ or $V_{ss}$, and therefore does not make a good estimate of the current leakage. For example, the simulator may estimate the leakage current of filler cell 100 as $1.56 \times 10^{-12}$ A. The present disclosure provides a solution to the problem associated with the filler cell 100 by connecting the gate interconnects of the filler cells 200, 300, 400 illustrated in FIGS. 2-4 and represented by schematic diagram 500 of FIG. 5 to either $V_{dd}$ or $V_{ss}$. By connecting the gate interconnects of filler cells 200, 300, 400 to either $V_{dd}$ or $V_{ss}$, simulations by an IC simulator may provide a more accurate estimation of leakage current as compared with the filler cell 100 of FIG. 1. For example, the simulator may estimate the leakage current of filler cells 200, 300, 400 as $1.91 \times 10^{43}$ A.

It is understood that the specific order or hierarchy of steps in the processes disclosed is an illustration of exemplary approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects." Unless specifically stated otherwise, the term "some" refers to one or more. Combinations such as "at least one of A, B, or C," "at least one of A, B, and C," and "A, B, C, or any combination thereof" include any combination of A, B, and/or C, and may include multiples of A, multiples of B, or multiples of C. Specifically, combinations such as "at least one of A, B, or C," "at least one of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

What is claimed is:

1. A standard cell integrated circuit (IC), comprising:
    a plurality of p-type metal oxide semiconductor (MOS) (pMOS) transistors, each pMOS transistor of the plurality of pMOS transistors having a pMOS transistor drain, a pMOS transistor source, and a pMOS transistor gate, each pMOS transistor drain and pMOS transistor source of the plurality of pMOS transistors being coupled to a first voltage source, each pMOS transistor gate of the plurality of pMOS transistors being formed by a pMOS gate interconnect of a plurality of pMOS gate interconnects, each of the pMOS gate interconnects extending in a first direction and being coupled to the first voltage source; and
    a plurality of n-type MOS (nMOS) transistors, each nMOS transistor of the plurality of nMOS transistors having an nMOS transistor drain, an nMOS transistor source, and an nMOS transistor gate, each nMOS transistor drain and nMOS transistor source of the plurality of nMOS transistors being coupled to a second voltage source lower than the first voltage source, each nMOS transistor gate of the plurality of nMOS transistors being formed by an nMOS gate interconnect of a plurality of nMOS gate interconnects, each of the nMOS gate interconnects extending in the first direction and being coupled to the second voltage source.

2. The standard cell IC of claim 1, further comprising:
    a first contact interconnect extending in a second direction orthogonal to the first direction and coupling the pMOS gate interconnects together, the first contact interconnect being coupled to the first voltage source; and
    a second contact interconnect extending in the second direction and coupling the nMOS gate interconnects together, the second contact interconnect being coupled to the second voltage source.

3. The standard cell IC of claim 2, wherein each pMOS gate interconnect of the plurality of pMOS gate interconnects is separated from and collinear with one nMOS gate interconnect of the plurality of nMOS gate interconnects in the first direction.

4. The standard cell IC of claim 2, wherein the standard cell IC has n grids with pitch p between the grids, and a width of approximately n*p, the grids extending in the first direction, and wherein the plurality of pMOS transistors comprise n−3 transistors and the plurality of nMOS transistors comprise n−3 transistors, the standard cell IC further comprising:
   a first dummy gate interconnect adjacent a first side of the standard cell IC and extending across the standard cell IC in the first direction, the first dummy gate floating; and
   a second dummy gate interconnect adjacent a second side of the standard cell IC and extending across the standard cell IC in the first direction, the second dummy gate floating.

5. The standard cell IC of claim 4, wherein the first contact interconnect and the second contact interconnect extend in the second direction between the first dummy gate interconnect and the second dummy gate interconnect.

6. The standard cell IC of claim 1, wherein the standard cell IC has n grids with pitch p between the grids, and a width of approximately n*p, the grids extending in the first direction, and wherein the plurality of pMOS transistors comprise n−1 transistors and the plurality of nMOS transistors comprise n−1 transistors.

7. A method of operation of a standard cell integrated circuit (IC), comprising:
   operating a plurality of p-type metal oxide semiconductor (MOS) (pMOS) transistors, each pMOS transistor of the plurality of pMOS transistors having a pMOS transistor drain, a pMOS transistor source, and a pMOS transistor gate, each pMOS transistor drain and pMOS transistor source of the plurality of pMOS transistors being coupled to a first voltage source, each pMOS transistor gate of the plurality of pMOS transistors being formed by a pMOS gate interconnect of a plurality of pMOS gate interconnects, each of the pMOS gate interconnects extending in a first direction and being coupled to the first voltage source; and
   operating a plurality of n-type MOS (nMOS) transistors, each nMOS transistor of the plurality of nMOS transistors having an nMOS transistor drain, an nMOS transistor source, and an nMOS transistor gate, each nMOS transistor drain and nMOS transistor source of the plurality of nMOS transistors being coupled to a second voltage source lower than the first voltage source, each nMOS transistor gate of the plurality of nMOS transistors being formed by an nMOS gate interconnect of a plurality of nMOS gate interconnects, each of the nMOS gate interconnects extending in the first direction and being coupled to the second voltage source.

8. The method of claim 7, wherein the standard cell IC further includes:
   a first contact interconnect extending in a second direction orthogonal to the first direction and coupling the pMOS gate interconnects together, the first contact interconnect being coupled to the first voltage source; and
   a second contact interconnect extending in the second direction and coupling the nMOS gate interconnects together, the second contact interconnect being coupled to the second voltage source.

9. The method of claim 8, wherein each pMOS gate interconnect of the plurality of pMOS gate interconnects is separated from and collinear with one nMOS gate interconnect of the plurality of nMOS gate interconnects in the first direction.

10. The method of claim 8, wherein the standard cell IC has n grids with pitch p between the grids, and a width of approximately n*p, the grids extending in the first direction, and wherein the plurality of pMOS transistors comprise n−3 transistors and the plurality of nMOS transistors comprise n−3 transistors, the standard cell IC further comprising:
   a first dummy gate interconnect adjacent a first side of the standard cell IC and extending across the standard cell IC in the first direction, the first dummy gate floating; and
   a second dummy gate interconnect adjacent a second side of the standard cell IC and extending across the standard cell IC in the first direction, the second dummy gate floating.

11. The method of claim 10, wherein the first contact interconnect and the second contact interconnect extend in the second direction between the first dummy gate interconnect and the second dummy gate interconnect.

12. The method of claim 7, wherein the standard cell IC has n grids with pitch p between the grids, and a width of approximately n*p, the grids extending in the first direction, and wherein the plurality of pMOS transistors comprise n−1 transistors and the plurality of nMOS transistors comprise n−1 transistors.

* * * * *